United States Patent [19]
Bernstein

[11] Patent Number: 5,991,990
[45] Date of Patent: Nov. 30, 1999

[54] METHOD FOR FABRICATING A TUNNELING SENSOR WITH LINEAR FORCE REBALANCE

[75] Inventor: Jonathan J. Bernstein, Medfield, Mass.

[73] Assignee: The Charles Stark Draper Laboratory, Inc., Cambridge, Mass.

[21] Appl. No.: 09/027,234

[22] Filed: Feb. 20, 1998

Related U.S. Application Data

[62] Division of application No. 08/694,333, Aug. 8, 1996, Pat. No. 5,752,410.

[51] Int. Cl.$^6$ ........................................................ H01G 5/06
[52] U.S. Cl. .................. 29/25.41; 73/514.18; 73/862.61
[58] Field of Search ........................ 29/25.41; 73/514.18, 73/514.23, 514.31, 514.32, 862.473, 862.61, 862.626

[56] References Cited

U.S. PATENT DOCUMENTS

| | | | |
|---|---|---|---|
| 5,163,328 | 11/1992 | Holland et al. | 73/717 |
| 5,178,012 | 1/1993 | Culp | 73/510 |
| 5,235,187 | 8/1993 | Arney et al. | 250/306 |
| 5,237,529 | 8/1993 | Spitzer | 365/158 |
| 5,241,235 | 8/1993 | Culp | 310/328 |
| 5,265,470 | 11/1993 | Kaiser et al. | 73/178 R |
| 5,277,067 | 1/1994 | Holland et al. | 73/723 |
| 5,285,686 | 2/1994 | Peters | 73/505 |
| 5,290,102 | 3/1994 | Kaiser et al. | 324/120 |
| 5,293,781 | 3/1994 | Kaiser et al. | 73/862.625 |
| 5,314,572 | 5/1994 | Core et al. | 156/643 |
| 5,315,247 | 5/1994 | Kaiser et al. | 324/244 |
| 5,326,726 | 7/1994 | Tsang et al. | 437/228 |
| 5,361,635 | 11/1994 | Woodruff | 73/517 B |
| 5,377,545 | 1/1995 | Norling et al. | 73/517 B |

OTHER PUBLICATIONS

Kobayashi, Dai et al., "An Integrated Lateral Tunneling Unit," Micro Electro Mechanical Systems, pp. 214–219, Feb. 4–7, 1992.

Grade, J., et al., "Progress in Tunnel Sensors," Solid State Sensor and Actuator Workshop, Hilton Head Island, South Carolina, pp. 80–85, Jun. 2–6, 1996.

*Primary Examiner*—Carl E. Hall
*Attorney, Agent, or Firm*—Weingarten, Schurgin, Gagnebin & Hayes LLP

[57] ABSTRACT

A tunneling sensor has a pair of force rebalance capacitors that are used in a push-pull relationship so as to provide a rebalance force that is a linear function of applied rebalance voltages, which leads to an output voltage that is linearly related to input acceleration. The tunneling sensor comprises a plate electrode that is formed from and attached to a silicon substrate by a pair of torsional flexures, which provide an axis of rotation for the plate electrode. A pendulous mass is formed on a first end of the plate electrode, and a tunnel-effect contact is formed on a second end of the plate electrode. A pair of torque rebalance bridge electrodes are formed on the substrate so as to span the plate electrode. A tunnel-effect tip is formed on the substrate so as to be proximate the tunnel-effect contact and in line with the rotational path that the tunnel-effect contact takes when the plate electrode is rotated.

7 Claims, 6 Drawing Sheets

METHOD FOR FABRICATING A TUNNELING SENSOR WITH LINEAR FORCE REBALANCE

This application is a division of U.S. patent application Ser. No. 08/694,333 filed Aug. 8, 1996, now U.S. Pat. No. 5,752,410.

FIELD OF INVENTION

The present invention relates generally to tunneling sensors and, more particularly, to a tunneling sensor with linear force rebalance and a method for fabricating the same.

BACKGROUND OF THE INVENTION

Some former force rebalance tunneling sensors used a single capacitor with a square law volts-to-force relationship. This yielded an output voltage proportional to the square root of the quantity to be measured. Alternative former force rebalance tunneling sensors used piezoelectric layers to perform the rebalance function.

Sensors providing a non-linear output are generally undesirable because they lead to harmonic distortion of the quantity being measured. Sensitivity also varies with the magnitude of input signals. Furthermore, the dynamic range over which a sensor yields a faithful representation of an input signal is reduced.

Piezoelectric rebalancing is generally inferior due to hysteresis, poor temperature and time stability, and small available displacements. The additional complexity of fabricating piezoelectric layers on a micromachined device is also undesirable.

On the other hand, linear force rebalancing increases dynamic range and reduces non-linearity, harmonic distortion, and intermodulation distortion. For many applications, such as phased arrays, linear operation is absolutely essential.

NASA's Jet Propulsion Laboratory (JPL) has designed a state of the art tunneling accelerometer device primarily for use in phased arrays (see "Tunnel-Effect Displacement Sensor", NASA Tech Briefs, Vol. 13, No. 9, Sep. 1989), but this device has several minor drawbacks that may act as barriers to practical use. For instance, the JPL device requires a high bias voltage. Specifically, the JPL device currently requires a 200 volt bias voltage to close the gap between the tunnel-effect tip. This large voltage is necessary because of a large capacitor gap (hundreds of microns) in the rebalance capacitor. This is an uncommonly high voltage for use in towed arrays, inasmuch as high voltages create corrosion and safety hazards in handling and testing. Furthermore, the circuitry required to generate such a high voltage can generate noise for the rest of the array.

Another drawback of the JPL device is that it employs non-linear force rebalance. A single capacitor is used for force rebalance in the JPL device, and the force across this single capacitor is proportional to the square of the applied voltage. This puts a non-linearity in the feedback loop wherein the output voltage is proportional to the square root of the incident acceleration. This, in turn, creates harmonic distortion, intermodulation, and phase non-linearity, which leads to reduced sensitivity and dynamic range. For array applications, linearity, uniform phase, and low distortion are essential to the combining of the numerous transducers which make up the array.

Still another drawback of the JPL device is its size, which is on the order of 8 mm. This is fairly large for a micromachined sensor. For many applications, such as thin line towed arrays, this is simply too large.

Accordingly, it would be desirable to overcome the disadvantages of former force rebalance tunneling sensors and thereby provide a tunneling sensor having a pair of force rebalance capacitors that are used in a push-pull relationship so as to provide a rebalance force that is a linear function of applied rebalance voltages, which leads to an output torque voltage that is linearly related to input acceleration.

SUMMARY OF THE INVENTION

The present invention contemplates a tunneling sensor having a pair of force rebalance capacitors that are used in a push-pull relationship so as to provide a rebalance force that is a linear function of applied rebalance voltages, which leads to an output torque voltage that is linearly related to input acceleration.

The present invention tunneling sensor, which is constructed primarily as a rotational accelerometer, comprises a plate electrode that is formed from and attached to a silicon substrate by a pair of torsional flexures, which provide an axis of rotation for the plate electrode. A pendulous mass is formed on a first end of the plate electrode, and a tunnel-effect contact is formed on a second end of the plate electrode. A pair of torque rebalance bridge electrodes are formed on the substrate so as to span the plate electrode. A tunnel-effect tip is formed on the substrate so as to be proximate the tunnel-effect contact and in line with the rotational path that the tunnel-effect contact takes when the plate electrode is rotated.

The plate electrode, and hence the tunnel-effect contact, are typically grounded, while the pair of torque rebalance bridge electrodes are complementarily driven with rebalance voltages, having a constant bias voltage component and a output torque voltage component, so as to generate an electrostatic rebalance force that is a linear function of the rebalance voltages. A small bias voltage is typically applied to the tunnel-effect tip so as to induce the tunnel current. The result is an output torque voltage that is linearly related to input acceleration.

Accordingly, the primary object of the present invention is to provide a tunneling sensor having a pair of force rebalance capacitors that are used in a push-pull relationship so as to provide a rebalance force that is a linear function of applied rebalance voltages, which leads to an output torque voltage that is linearly related to input acceleration.

The above primary object, as well as other objects, features, and advantages, of the present invention will become readily apparent from the following detailed description which is to be read in conjunction with the appended drawings.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

Figure 1:
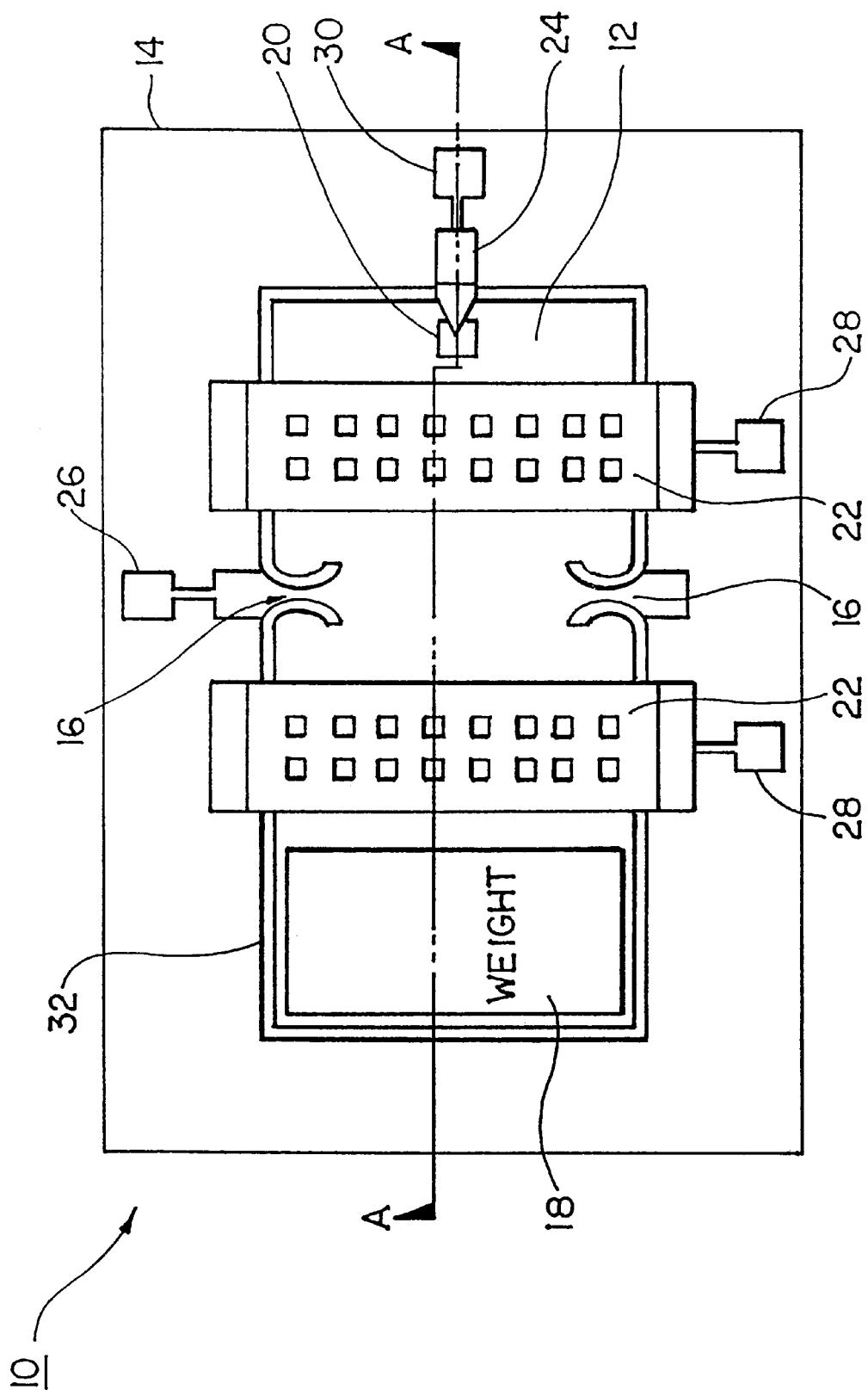
FIG. 1 is a plan view of a tunneling sensor with linear force rebalance according to the present invention.
Figure 4:
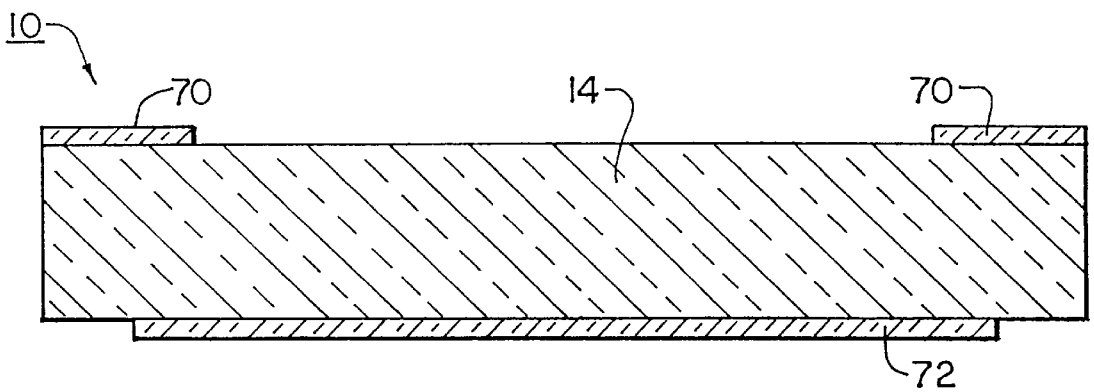
FIG. 4 is a cross-sectional side view, taken in relation to line A—A of FIG. 1, of the tunneling sensor shown in FIG.
Figure 5:
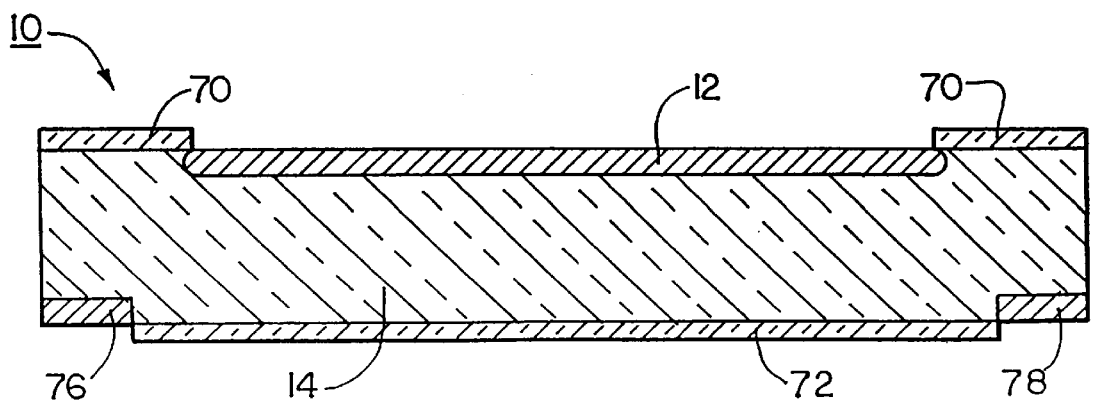
Figure 6:
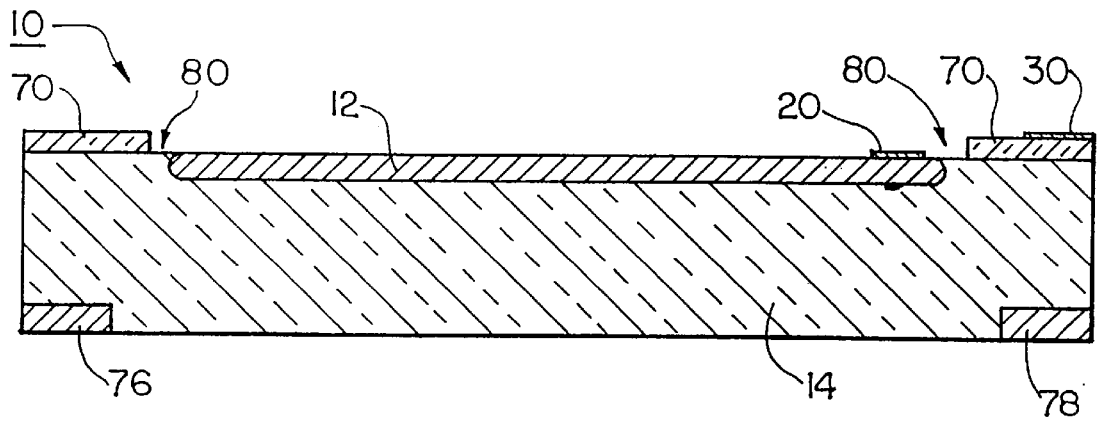
Figure 7:
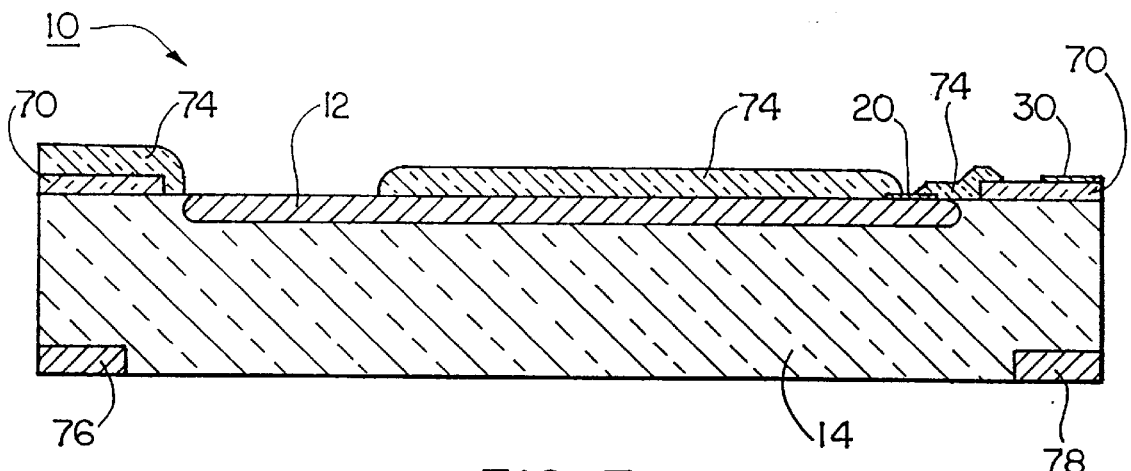
Figure 8:
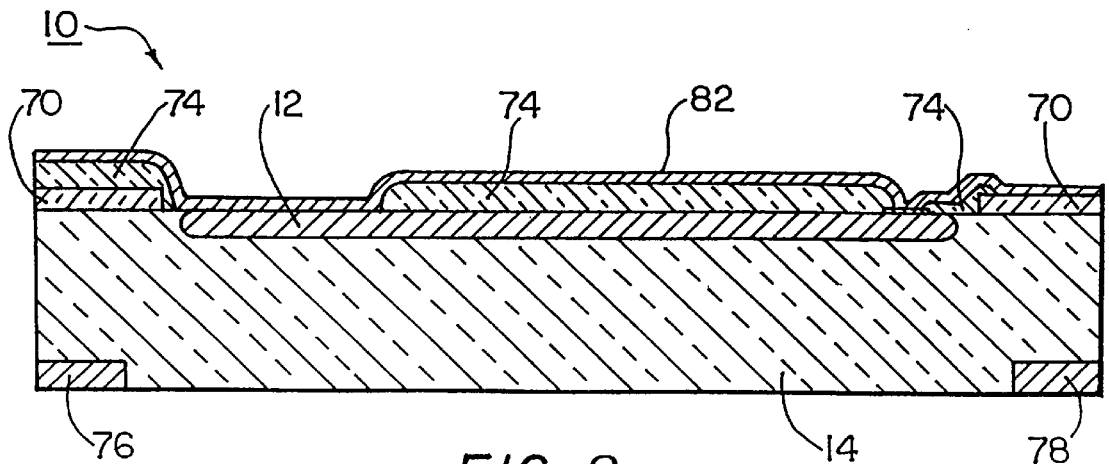
Figure 9:
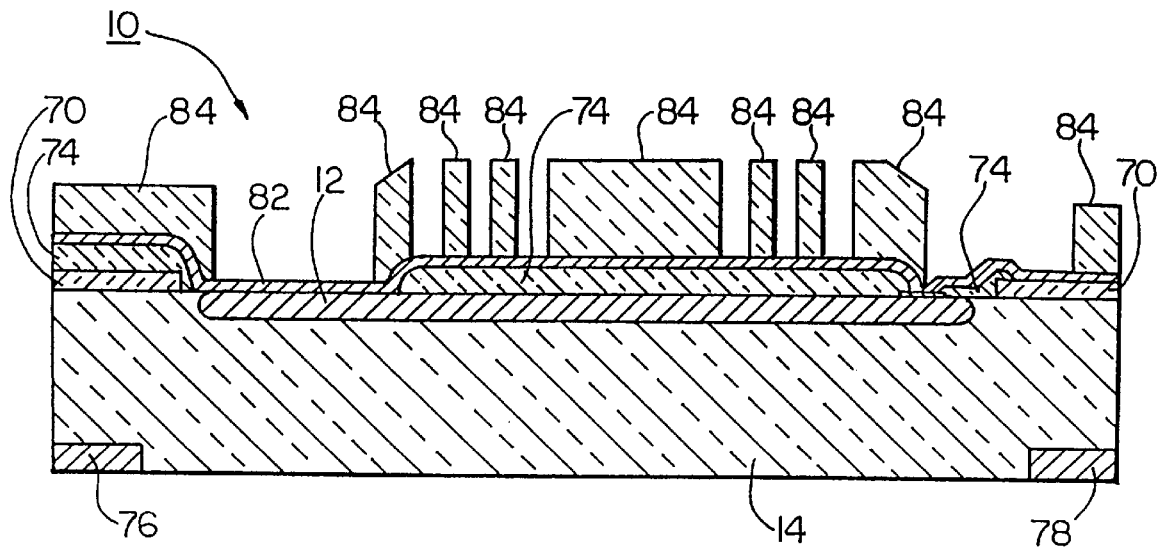
Figure 10:
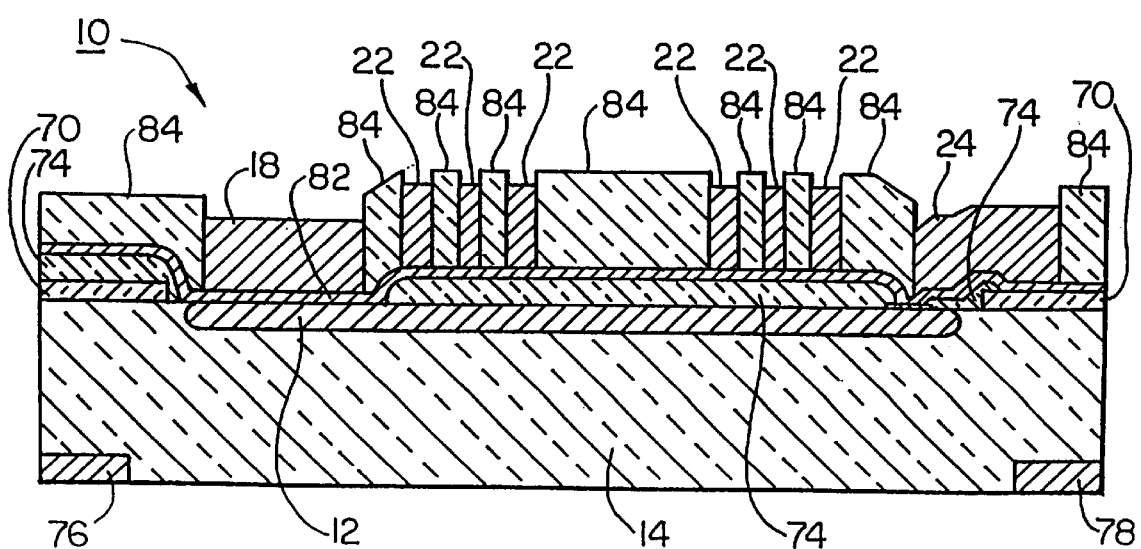
Figure 11:
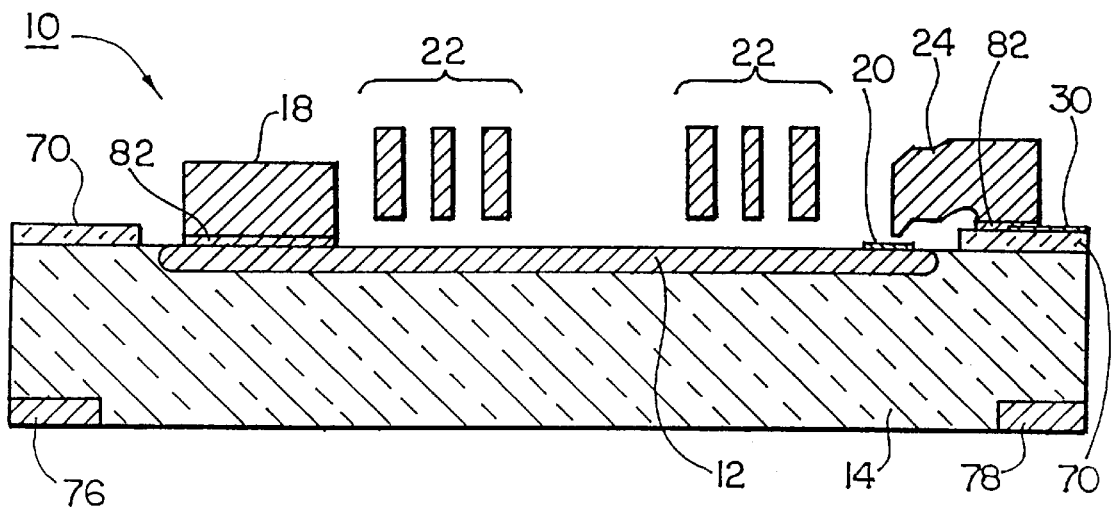
Figure 12:
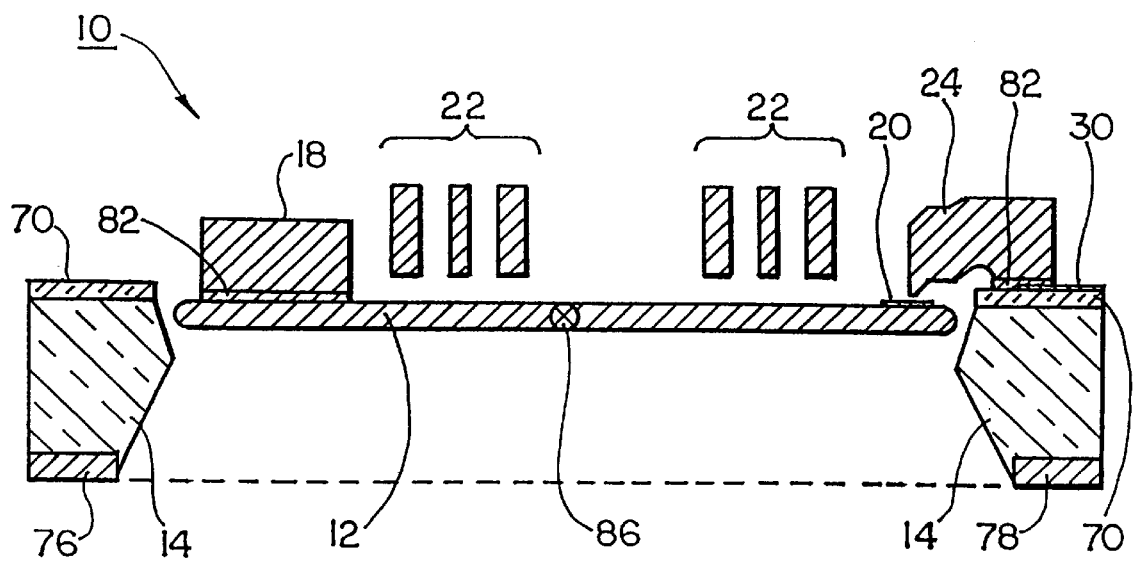

3 after the initial oxide layer has been patterned on both its front and back sides;

FIG. 5 is a cross-sectional side view, taken in relation to line A—A of FIG. 1, of the tunneling sensor shown in FIG. 4 after a boron diffusion has been performed on the silicon wafer through the patterned openings in the initial oxide;

FIG. 6 is a cross-sectional side view, taken in relation to line A—A of FIG. 1, of the tunneling sensor shown in FIG. 5 after the initial oxide has been photolithographicly removed from certain regions thereof;

FIG. 7 is a cross-sectional side view, taken in relation to line A—A of FIG. 1, of the tunneling sensor shown in FIG. 6 after a sacrificial (spacer) layer has been deposited on selected patterned regions;

FIG. 8 is a cross-sectional side view, taken in relation to line A—A of FIG. 1, of the tunneling sensor shown in FIG. 7 after a thin metal (seed) layer has been deposited thereon;

FIG. 9 is a cross-sectional side view, taken in relation to line A—A of FIG. 1, of the tunneling sensor shown in FIG. 8 after an electroplating mask has been deposited and patterned thereon;

FIG. 10 is a cross-sectional side view, taken in relation to line A—A of FIG. 1, of the tunneling sensor shown in FIG. 9 after a pendulous weight, bridge electrodes, and a tunnel tip have been electroplated in the open areas of the electroplating mask;

FIG. 11 is a cross-sectional side view, taken in relation to line A—A of FIG. 1, of the tunneling sensor shown in FIG. 10 after the electroplating mask, the sacrificial (spacer) layer, and the exposed portions of the thin metal (seed) layer have been removed by polymer stripping;

FIG. 12 is a cross-sectional side view, taken in relation to line A—A of FIG. 1, of the tunneling sensor shown in FIG. 11 after an anisotropic EDP etch (ethylene-diamine, pyrocatechol, and water) is preformed to substantially free up the plate electrode.

DETAILED DESCRIPTION OF A PREFERRED EMBODIMENT

Referring to FIG. 1, there is shown a plan view of a tunneling sensor 10 with linear force rebalance according to the present invention. The present invention tunneling sensor 10, which is constructed primarily as a rotational accelerometer, comprises a plate electrode 12 that is formed from and attached to a substrate 14 by a pair of torsional flexures 16 that provide an axis of rotation about which the plate electrode 12 is rotatable. The plate electrode 12 and the pair of torsional flexures 16 are typically etched out from the substrate 14, as indicated by the etch slot 32 shown in FIG. 1 (also see FIG. 12) and as will be described in detail below.

A pendulous mass 18 is formed on a first end of the plate electrode 12, and a tunnel-effect contact 20 is formed on a second end of the plate electrode 12. A pair of torque rebalance bridge electrodes 22 are formed on the substrate 14 so as to span the plate electrode 12 (see FIG. 12). A tunnel-effect tip 24 is formed on the substrate 14 so as to be proximate the tunnel-effect contact 20 and in line with the rotational path that the tunnel-effect contact 20 takes when the plate electrode 12 is rotated. It should be noted that the pendulous mass 18 and the tunnel-effect contact 20 may be formed on the same end of the plate electrode 12 if such is adjusted for in the applied rebalance voltages, as described in detail below.

The plate electrode 12, through one of the pair of torsional flexures 16, each of the pair of torque rebalance bridge electrodes 22, and the tunnel-effect tip 24 all have associated electrically conductive contacts 26, 28, and 30, respectively, so as to allow for wire bonding during packaging.

At this point it should be noted that the substrate 14 is typically bulk silicon and the plate electrode 12 is typically a boron diffused portion thereof, as is described in detail below. The pair of torsional flexures 16 are included as part of the boron diffused area, as indicated by the shaded area shown in FIG. 1. The pendulous mass 18, the pair of torque rebalance bridge electrodes 22, and the tunnel-effect tip 24 are all typically electroplated gold, or an electroplated gold layer covered by another electroplated metal, as is also described in detail below. The tunnel-effect contact 20 and all of the other electrically conductive contacts 26, 28, and 30 are typically formed of a bi-metal layer such as chrome-gold, as is further described in detail below.

It should also be noted that the pair of torque rebalance bridge electrodes 22 are preferably symmetrically spaced and located over opposite ends of the plate electrode 12, equidistant from the rotational axis provided by the pair of torsional flexures 16, so as to facilitate in the rebalance force linearization. Otherwise, a compensation voltage component must be added to the applied rebalance voltages in order to achieve linearization.

Figure 2:
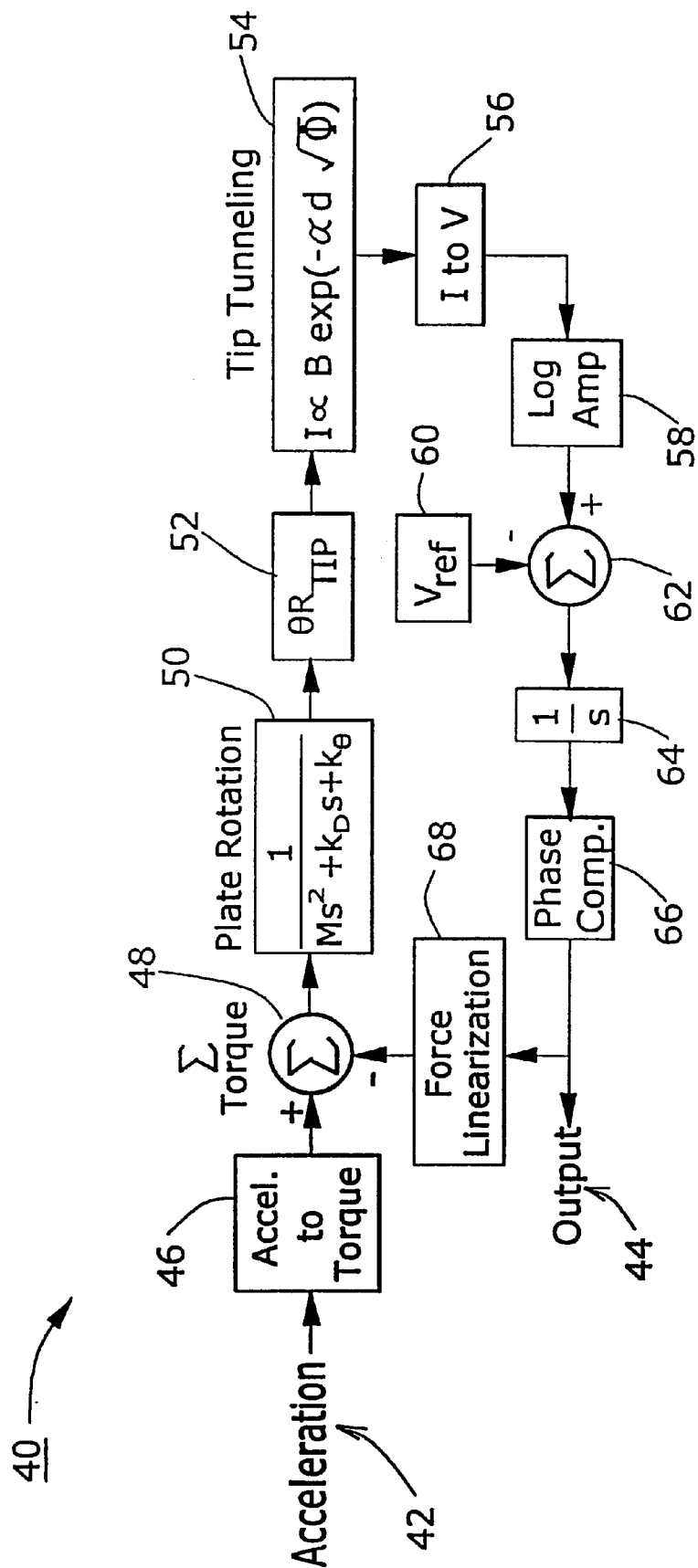
FIG. 2 is a schematic block diagram of a control system for the tunneling sensor shown in FIG. 1.

Referring to FIG. 2, there is shown a schematic block diagram of a control system 40 for the present invention tunneling sensor 10 shown in FIG. 1. The control system 40 has a stiff feedback loop since the relative movement between the tunnel-effect tip 24 and the tunnel-effect contact 20 is preferably limited to ±5 Å in use. Because of the high loop gain required, stability is an issue, and compensation will be required to ensure phase margin near the unity loop gain frequency. In accordance with the present invention, the control system 40 is shown having an input acceleration 42 and an output torque voltage 44 that is linearly related to the input acceleration 42.

The control system 40 comprises an acceleration to torque conversion block 46 wherein the input acceleration 42 is converted into torque as a result of the pendulous nature of the plate electrode 12 and the pendulous mass 18. The acceleration to torque conversion is essentially realized by multiplying the weight of the pendulous mass 18 by the distance between the center of gravity of the pendulous mass 18 and the axis of rotation running through the pair of torsional flexures 16. The converted torque is summed with torque that is produced as a result of the electrostatic rebalance force between the pair of torque rebalance bridge electrodes 22 and the plate electrode 12.

The control system 40 also comprises a plate rotation block 50 representing the differential equation modeling the mechanical motion of the tunneling sensor 10 in response to an applied torque. The coefficients of M, $k_D$, and $k_\theta$ are the total moment of inertia of the plate electrode 12 and the pendulous mass 18, a damping spring constant, and a rotational spring constant, respectively. An angular to linear displacement conversion is performed on the output of the plate rotation block 50. $\theta$ is the angle of rotation of the plate electrode 12 in radians, and $R_{tip}$ represents the distance from the axis of rotation running through the pair of torsional flexures 16 to the tunnel-effect tip 24.

A tip tunneling block 54 describes the current flow across the gap between the tunnel-effect contact 20 and the tunnel-effect tip 24. I represents the tunnel current, B represents a bias voltage applied across the gap, $\alpha$ is a constant related to the tunnel current, d is the linear displacement across the gap ($\theta R_{tip}$), and $\Phi$ represents the potential barrier to the tunnel current. The tip tunneling block 54 mathematically models the current-voltage relationship at the tunneling tip.

The tunnel current, I, is converted into a representative voltage, V, and a logarithmic amplifier 58 linearizes the exponential dependence of the tunnel current, I, on the tip displacement, d. A reference voltage, $V_{ref}$, corresponding to a desired quiescent point for the control loop (I≈1 nA, d≈5–10 Å) is summed with the output of the logarithmic amplifier 58 so as to determine if any difference exists therebetween. The resultant difference signal, if any exists, is passed through an integrator 64 and a phase compensator 66 so as to provide the output torque voltage 44 which is linearly related to the input acceleration 42.

The force linearization block 68 utilizes the output torque voltage 44 to generate the complementary rebalance voltages for the pair of torque rebalance bridge electrodes 22. These complementary rebalance voltages are produced by adding and subtracting a constant bias voltage ($V_{bias}$) to the output torque voltage ($V_{torque}$). These sum and difference voltages are then applied to the pair of torque rebalance bridge electrodes 22 so as to generate a rebalance torque against the plate electrode 12 that is proportional to $4V_{bias} \cdot V_{torque}$. Thus, the rebalance force is linearly related to the output torque voltage 44, and hence to the input acceleration 42. It should be noted that the voltage level for the constant bias voltage ($V_{bias}$) is typically 10 VDC.

At this point it should be noted that the plate electrode 12, and hence the tunnel-effect contact 20, are typically grounded, and a small bias voltage is typically applied to the tunnel-effect tip 24. The voltage level for the bias voltage is typically 0.2 VDC.

It should also be noted that the present invention tunneling sensor 10 yields sensitivity on the order of 20 ng/√Hz at 1 kHz. According to theoretical analyses, this is substantially more sensitive than mere capacitive pickoffs at this frequency.

The method for fabricating the present invention tunneling sensor 10 is in itself novel. FIGS. 3–12 show cross sections of the tunneling sensor 10 at sequential stages of fabrication.

Figure 3:
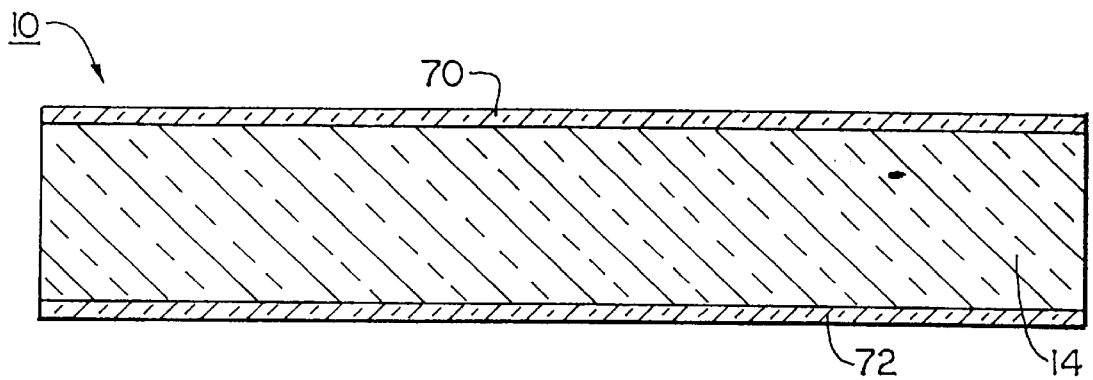
FIG. 3 is a cross-sectional side view, taken in relation to line A—A of FIG. 1, of a tunneling sensor according to the present invention in its initial fabrication stage.

Referring to FIG. 3, the tunneling sensor 10 is shown in its initial fabrication stage comprising the silicon wafer substrate 14 that is coated on both its front and back sides with front 70 and back 72 dielectric layers, which may be silicon dioxide, silicon nitride, or silicon carbide. The preferred material for the dielectric layers 70 and 72 is thermally grown silicon dioxide.

Referring to FIG. 4, the tunneling sensor 10 is shown after the front 70 and back 72 dielectric layers (hereinafter referred to as the initial oxidation, or initial oxide, layers) have been patterned using conventional photolithography and either wet or dry etching.

Referring to FIG. 5, the tunneling sensor 10 is shown after a boron diffusion has been performed on selected regions 12, 76, and 78 of the silicon wafer 14 through the patterned openings in the initial oxide layers 70 and 72. The initial oxide layers 70 and 72 are used as a diffusion mask to selectively diffuse boron through the patterned openings. The boron diffusion is preferably carried out using a solid source boron diffusion at a temperature between 1100° C. and 1200° C., although gas sources can also be used.

Referring to FIG. 6, the tunneling sensor 10 is shown after the initial oxide layers 70 and 72 have been photolithographiclly removed from certain regions, such as etch slot regions 80, and from the back side of the silicon wafer 14. Also, a first bi-metal layer has been deposited by sputtering or evaporating on selected patterned regions so as to form a tunnel-effect contact 20 and various wire bond contacts, including those for the plate electrode 26, the bridge electrodes 28, and the tunnel-effect tip 30. This first bi-metal layer is preferably chrome-gold, titanium-gold, or titanium/tungsten-gold.

Referring to FIG. 7, the tunneling sensor 10 is shown after a sacrificial (spacer) layer 74 has been deposited on selected patterned regions. This spacer layer 74 may be photoresist, polyimide, silicon dioxide, polysilicon, or other sacrificial layers known to those skilled in the art. The preferred spacer layer material is positive photoresist.

Referring to FIG. 8, the tunneling sensor 10 is shown after a thin metal (seed) layer 82 has been deposited (by sputtering) over the entire front side of the wafer structure so as to serve as a plating base for subsequent electroplating which will form the bridge electrodes 22. This seed layer 82 must have good adhesion to the various materials exposed on the front side of the wafer structure, in addition to allowing easy electroplating. Typically this seed layer 82 is formed of a bi-metal deposit, with the first metal layer being chosen for good adhesion to silicon dioxide and the second metal layer being chosen for easy electroplating. The first metal (adhesion) layer is typically titanium, chromium, titanium-tungsten alloy, or aluminum. The second metal (electroplating) layer is typically gold, chromium, copper, silver, nickel, palladium, or platinum. A preferred embodiment uses a titanium-gold bi-layer as the plating base (seed) layer 82.

Referring to FIG. 9, the tunneling sensor 10 is shown after an electroplating mask 84 has been deposited and patterned. This mask 84 may be photoresist, e-beam resist, x-ray resist, or polyimide. A preferred implementation uses a photoresist as the plating mask 84.

Referring to FIG. 10, the tunneling sensor 10 is shown after the pendulous weight 18, the bridge electrodes 22, and the tunnel-effect tip 24 have been electroplated in the open areas of the electroplating mask 84. Gold is the preferred metal for the electroplating, since gold is the preferred tunnel contact metal. Alternatively, a thin gold layer may be electroplated first, and a thicker layer of some other metal, such as nickel, silver, or copper, may be electroplated thereon. It should be noted that the bridge electrodes 22 have perforations formed therein so as to reduce the damping spring coefficient, $k_D$.

Referring to FIG. 11, the tunneling sensor 10 is shown after the electroplating mask 84, the sacrificial (spacer) layer 74, and the exposed portions of the thin metal (seed) layer 82 have been removed by polymer stripping. The polymer stripping is typically done in photoresist stripper, acetone, or by an oxygen plasma. The portion of the seed layer 82 that is not protected by the electroplated material 18 and 24 is stripped by an appropriate wet or dry etch, such as are well known in the industry.

Referring to FIG. 12, the tunneling sensor 10 is shown after an anisotropic EDP etch (ethylene-diamine, pyrocatechol, and water) is preformed to substantially free up the plate electrode 12. At this point, the tunneling sensor 10, which is typically fabricated in an array of like sensors on the silicon wafer 14, is ready for separation and packaging. Also shown is the axis of rotation 86 of the plate electrode 12 running through the pair of torsional flexures 16.

In view of the foregoing, it can be easily understood that the present invention tunneling sensor 10 is smaller and easier to use in common applications than the JPL device or similar sensor devices. For example, the present invention tunneling sensor 10 can easily fit on a 3 mm chip and can be used as an accelerometer, a vibration sensor, a magnetic field sensor, a pressure sensor, a hydrophone, and a microphone.

Also, the present invention tunneling sensor 10 requires only moderate voltage levels (typically 20 volts) to achieve rebalance and tip contact due to the small capacitor gaps (typically 2 microns) used in surface micromachining.

The present invention is not to be limited in scope by the specific embodiment described herein. Indeed, various modifications of the present invention, in addition to those described herein, will be apparent to those of skill in the art from the foregoing description and accompanying drawings. Thus, such modifications are intended to fall within the scope of the appended claims. Additionally, various references are cited throughout the specification, the disclosures of which are each incorporated herein by reference in their entirety.

What is claimed is:

1. A method for fabricating a tunneling sensor with linear force rebalance, said method comprising the steps of:

providing a substrate having an insulator formed thereon;

patterning said insulator and diffusing said substrate so as to form a plate electrode therein;

depositing a tunnel-effect contact on said plate electrode;

electroplating a pair of bridge electrodes and a tunnel-effect tip on said insulator so as to be disposed proximate said plate electrode; and etching selected areas of said substrate so as to free said plate electrode from said substrate except for where at least two torsion flexures are formed between said plate electrode and said substrate thus forming an axis of rotation about which said plate electrode is movable, said plate electrode thereby having a first end and a second end separated by said axis of rotation, a first bridge electrode in said pair being disposed proximate said first end of said plate electrode, a second bridge electrode in said pair being disposed proximate said second end of said plate electrode, said tunnel-effect tip being disposed proximate said tunnel-effect contact so as to be in line with a rotational path that said tunnel-effect contact takes when said plate electrode is moved about said axis of rotation.

2. The method as defined in claim 1, wherein said step of electroplating said pair of bridge electrodes comprises electroplating said pair of bridge electrodes so as to be symmetrically spaced and located equidistant from said axis of rotation.

3. The method as defined in claim 1, further comprising the step of electroplating said pair of bridge electrodes so as to have perforations formed therein.

4. The method as defined in claim 1, further comprising the steps of:

depositing a sacrificial layer on selected areas of said substrate, said plate electrode, and said insulator; and etching said sacrificial layer so that said pair of bridge electrodes span said plate electrode and a gap is formed between said tunnel-effect tip and said tunnel-effect contact.

5. The method as defined in claim 4, further comprising the steps of:

depositing a thin metal layer on selected areas of said substrate, said plate electrode, said insulator, and said sacrificial layer; and etching said thin metal layer along with said sacrificial layer.

6. The method as defined in claim 1, further comprising the step of forming a pendulous mass on one end of said plate electrode.

7. The method as defined in claim 1, wherein said step of diffusing said substrate comprises performing a boron diffusion using a solid source boron diffusion at a temperature between 1100° C. and 1200° C.

* * * * *